(12) United States Patent
Sakamoto (10) Patent No.: US 11,996,670 B2
(45) Date of Patent: May 28, 2024

(54) FIBER LASER SYSTEM AND METHOD FOR CONTROLLING SAME

(71) Applicant: FUJIKURA LTD., Tokyo (JP)

(72) Inventor: Shinichi Sakamoto, Chiba (JP)

(73) Assignee: Fujikura Ltd., Tokyo (JP)

( * ) Notice: Subject to any disclaimer, the term of this patent is extended or adjusted under 35 U.S.C. 154(b) by 487 days.

(21) Appl. No.: 16/973,700

(22) PCT Filed: Jun. 12, 2019

(86) PCT No.: PCT/JP2019/023288
§ 371 (c)(1),
(2) Date: Dec. 9, 2020

(87) PCT Pub. No.: WO2019/240171
PCT Pub. Date: Dec. 19, 2019

(65) Prior Publication Data
US 2021/0257801 A1 Aug. 19, 2021

(30) Foreign Application Priority Data
Jun. 12, 2018 (JP) .................................. 2018-112155

(51) Int. Cl.
*H01S 3/067* (2006.01)
*H01S 3/094* (2006.01)
(Continued)

(52) U.S. Cl.
CPC ...... *H01S 3/06704* (2013.01); *H01S 3/06708* (2013.01); *H01S 3/0675* (2013.01);
(Continued)

(58) Field of Classification Search
CPC .... H01S 3/1022; H01S 3/1312; H01S 3/0941; H01S 3/09415; H01S 3/2383; H01S 3/094053
See application file for complete search history.

(56) References Cited

U.S. PATENT DOCUMENTS 8,420,977 B2* 4/2013 Bradley .............. F41H 13/0062
219/121.67
10,840,665 B2* 11/2020 Honda .................. H01S 3/0014
(Continued)

FOREIGN PATENT DOCUMENTS

CN 104737391 A 6/2015
DE 102016120175 B4 * 1/2019 ........... H01S 3/0675
(Continued)

OTHER PUBLICATIONS

International Preliminary Report on Patentability issued in corresponding International Application No. PCT/JP2019/023288 issued Dec. 15, 2020 (9 pages).
(Continued)

*Primary Examiner* — Joshua King
(74) *Attorney, Agent, or Firm* — Osha Bergman Watanabe & Burton LLP (57) ABSTRACT

A fiber laser system including: fiber laser units each including an excitation light source; a combiner that combines laser beams generated by the respective fiber laser units; and a controller that controls strength of a driving current supplied to each of the excitation light sources and reduces a difference in power between the respective laser beams.

8 Claims, 4 Drawing Sheets

(51) Int. Cl.
  *H01S 3/0941* (2006.01)
  *H01S 3/102* (2006.01)
  *H01S 3/131* (2006.01)
  *H01S 3/23* (2006.01)

(52) U.S. Cl.
  CPC ........ *H01S 3/0941* (2013.01); *H01S 3/09415* (2013.01); *H01S 3/1022* (2013.01); *H01S 3/2383* (2013.01); *H01S 3/094053* (2013.01); *H01S 3/09408* (2013.01); *H01S 3/1312* (2013.01)

(56) References Cited

U.S. PATENT DOCUMENTS

| | | | |
|---|---|---|---|
| 2004/0114213 A1* | 6/2004 | Yamaguchi | H01S 3/06754 359/341.3 |
| 2004/0196539 A1* | 10/2004 | Chang | H01S 3/1001 359/341.41 |
| 2005/0220161 A1* | 10/2005 | Bolshtyansky | H04B 10/532 372/69 |
| 2007/0115537 A1* | 5/2007 | Mongardien | H04B 10/2916 359/334 |
| 2008/0173392 A1* | 7/2008 | Tanaka | B23K 26/0608 156/380.9 |
| 2010/0033508 A1* | 2/2010 | Mizushima | G09G 3/3413 372/38.02 |
| 2013/0299474 A1* | 11/2013 | Kashiwagi | B23K 26/042 219/121.81 |
| 2014/0139908 A1* | 5/2014 | Liu | H01S 3/094061 359/341.3 |
| 2015/0214692 A1* | 7/2015 | Miyato | H01S 3/06716 372/6 |
| 2015/0229095 A1* | 8/2015 | Miyato | H01S 3/08009 372/6 |
| 2016/0308328 A1* | 10/2016 | Sakamoto | H01S 3/067 |
| 2016/0359288 A1* | 12/2016 | Matsuoka | G02B 6/4286 |
| 2017/0070031 A1* | 3/2017 | Takigawa | H01S 5/06216 |
| 2017/0179672 A1* | 6/2017 | Kashiwagi | H01S 3/2383 |
| 2018/0138654 A1* | 5/2018 | Chiba | B23K 26/0626 |
| 2018/0247256 A1* | 8/2018 | Takigawa | H01S 3/1317 |

FOREIGN PATENT DOCUMENTS

| | | | | |
|---|---|---|---|---|
| EP | 2363927 A2 * | 9/2011 | | H01S 3/06754 |
| JP | 2004-214225 A | 7/2004 | | |
| JP | 2004214225 A * | 7/2004 | | |
| JP | 200695911 A | 4/2006 | | |
| JP | 2014-082307 A | 5/2014 | | |
| JP | 2015-159208 A | 9/2015 | | |
| JP | 2016-078050 A | 5/2016 | | |
| JP | 2017-084964 A | 5/2017 | | |
| KR | 20170107362 A * | 9/2017 | | |
| WO | 2014/091551 A1 | 6/2014 | | |
| WO | WO-2015002003 A1 * | 1/2015 | | H01S 3/1305 |
| WO | WO-2015002004 A1 * | 1/2015 | | B23K 26/0604 |
| WO | 2015/111711 A1 | 7/2015 | | |
| WO | WO-2018142857 A1 * | 8/2018 | | B23K 26/062 |

OTHER PUBLICATIONS

International Search Report issued in corresponding International Application No. PCT/JP2019/023288 mailed Sep. 3, 2019 (2 pages).

* cited by examiner

FIBER LASER SYSTEM AND METHOD FOR CONTROLLING SAME

TECHNICAL FIELD

The present invention relates to a fiber laser system including a plurality of fiber laser units. The present invention also relates to a method of controlling such a fiber laser system.

BACKGROUND

Fiber laser systems each including a plurality of fiber laser units are used as processing laser devices. The power of output light of a fiber laser system substantially matches the sum of the power of the laser beams generated by respective fiber laser units. The power of the laser beam generated by each fiber laser unit is determined according to the strength of a driving current that drives an excitation light source included in the fiber laser unit. Therefore, the power of the output light of the fiber laser system is controlled by changing the strength of the driving current that drives the excitation light source included in each of the fiber laser units.

Patent Literature 1, for example, discloses a technique for controlling the power of output light of a fiber laser system. According to the technique disclosed in Patent Literature 1, an accumulated value of driving times of each fiber laser unit, which is weighted according to the strength of the driving current that drives the excitation light source included in the fiber laser unit, is associated with the fiber laser unit and stored. Then, according to the technique disclosed in Patent Literature 1, fiber laser units, the number of which corresponds to the target value of the power of the output light of the fiber laser system, are selected in order from the ones having the smallest accumulated value, and emit light.

CITATION LIST

Patent Literature

[Patent Literature 1]
Japanese Patent Application Publication Tokukai No. 2017-84964 (Publication Date: May 18, 2017)

However, according to the conventional fiber laser system, the occurrence of random failure of the excitation light source (hereinafter also referred to as "sudden death") in any fiber laser unit results in a variance in the power of laser beams generated by the respective fiber laser units. If the variance occurs in the power of the laser beams generated by the respective fiber laser units, Stokes oscillation, which is caused by stimulated Raman scattering, may occur, starting from a fiber laser unit which generates a laser beam having relatively large power. This may result in a failure of the fiber laser system.

With the fiber laser system disclosed in Patent Literature 1, it is not possible to restrict the variance in the power of the laser beams generated by the respective fiber laser units. With the fiber laser system disclosed in Patent Literature 1, therefore, it is not possible to reduce the possibility of failure which is caused by Stokes oscillation.

SUMMARY

Embodiments of the present invention achieve a fiber laser system in which a failure caused by Stokes oscillation is unlikely to occur.

A fiber laser system in accordance with an aspect of the present invention includes: a plurality of fiber laser units; a combiner configured to combine laser beams generated by the respective plurality of fiber laser units; and a control section (or controller) configured to control strength of a driving current to be supplied to each of excitation light sources included in each of the plurality of fiber laser units so that a difference in power between the respective laser beams generated by the plurality of fiber laser units is small.

A control method in accordance with an aspect of the present invention is a method of controlling a fiber laser system, the fiber laser system including: a plurality of fiber laser units; and a combiner configured to combine laser beams generated by the respective plurality of fiber laser units. The method includes the step of: (a) controlling strength of a driving current to be supplied to each of excitation light sources included in each of the plurality of fiber laser units so that a difference in power between the respective laser beams generated by the plurality of fiber laser units is small.

With the fiber laser system in accordance with one or more embodiments of the present invention, it is possible to achieve a fiber laser system in which a failure caused by Stokes oscillation is unlikely to occur.

DETAILED DESCRIPTION OF EMBODIMENTS (Configuration of Fiber Laser System)

Figure 1:
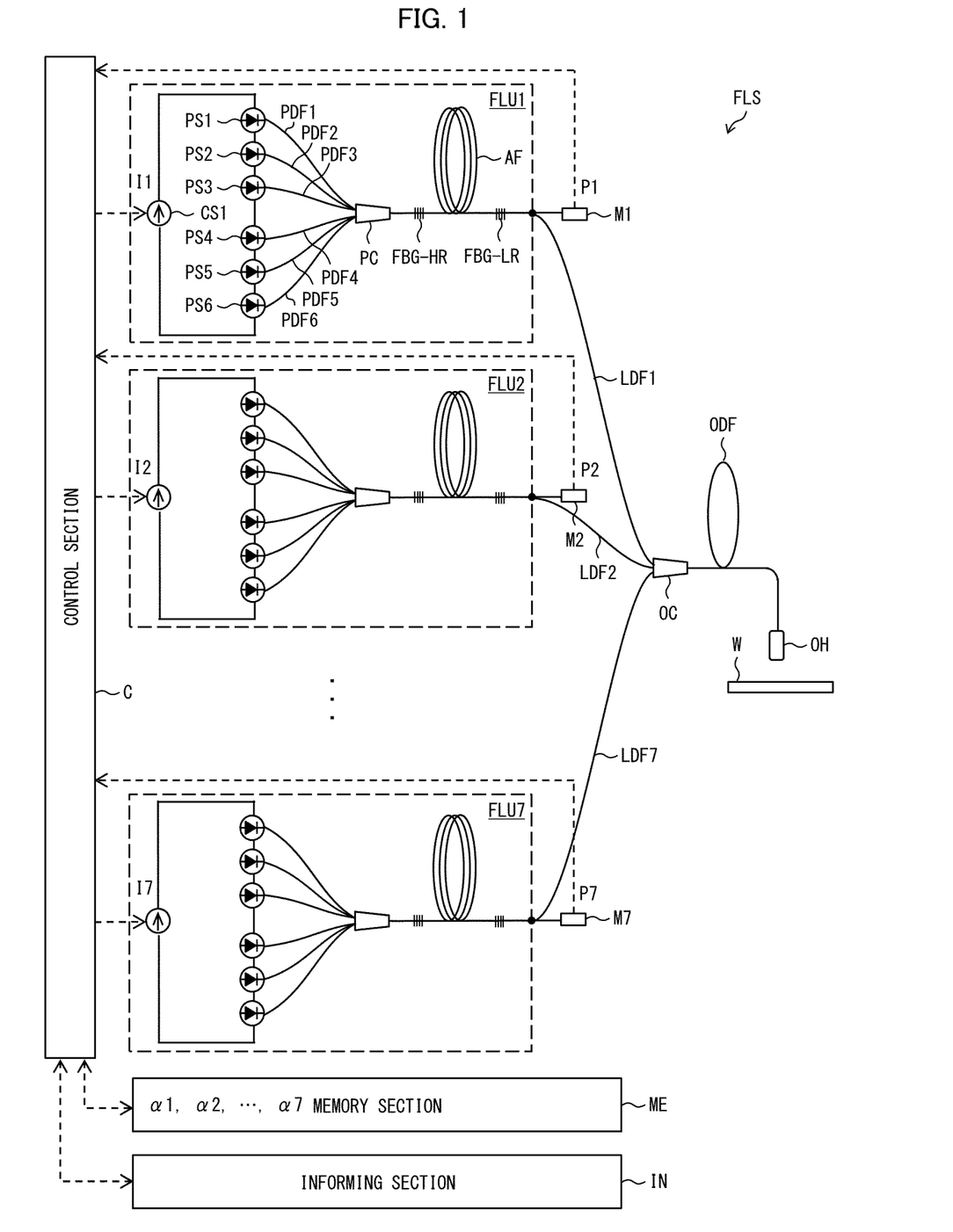
FIG. 1 is a view illustrating a configuration of a fiber laser system in accordance with one or more embodiments of the present invention.

The following description will discuss, with reference to FIG. 1, a configuration of a fiber laser system FLS in accordance with one or more embodiments of the present invention. FIG. 1 is a block diagram illustrating a configuration of the fiber laser system FLS.

The fiber laser system FLS is a laser device for processing a workpiece W. As illustrated in FIG. 1, the fiber laser system FLS includes (i) n fiber laser units FLU1 to FLUn, (ii) n laser delivery fibers LDF1 to LDFn, (iii) an output combiner OC, (iv) an output delivery fiber ODF, (v) an output head OH, (vi) n laser power measuring sections M1 to Mn, (vii) a control section C, (viii) a memory section ME, and (ix) an informing section IN. The fiber laser units FLU1 to FLUn and the laser delivery fibers LDF1 to LDFn are in one-to-one correspondence with each other. Note that n is a natural number of 2 or greater, and indicates the number of the fiber laser units FLU1 to FLUn and the number of the laser delivery fibers LDF1 to LDFn. FIG. 1 shows an example of the configuration of the fiber laser system FLS in which n is 7.

A fiber laser unit FLUi (i is a natural number of 1 or greater and n or less) generates a laser beam. According to one or more embodiments, the fiber laser units FLU1 to FLUn are each a forward excitation fiber laser. The fiber laser unit FLUi is connected to an input terminal of a corresponding laser delivery fiber LDFi. A laser beam generated by the fiber laser unit FLUi is introduced into the laser delivery fiber LDFi.

The laser delivery fiber LDFi guides the laser beam generated by the corresponding fiber laser unit FLUi. According to one or more embodiments, the laser delivery fibers LDF1 to LDFn are each a single-mode fiber or a few-mode fiber. An output terminal of the laser delivery fiber LDFi is connected to an input port of the output combiner OC. The laser beam, which has been generated by the fiber laser unit FLUi and guided through the laser delivery fiber LDFi, is introduced into the output combiner OC via the input port.

The output combiner OC combines laser beams which have been generated by the respective fiber laser units FLU1 to FLUn and guided through the corresponding laser delivery fibers LDF1 to LDFn. An output port of the output combiner OC is connected to an input terminal of the output delivery fiber ODF. The combined laser beam synthesized by the output combiner OC is inputted to the output delivery fiber ODF.

The output delivery fiber ODF guides the combined laser beam synthesized by the output combiner OC. According to one or more embodiments, the output delivery fiber ODF is a multi-mode fiber. An output terminal of the output delivery fiber ODF is connected to the output head OH. The combined laser beam synthesized by the output combiner OC irradiates a workpiece (to be processed) through the output head OH.

A laser power measuring section Mi (i is a natural number of 1 or greater and n or less) measures the power of the laser beam generated by the corresponding fiber laser unit FLUi. According to one or more embodiments, the laser power measuring section Mi is a photodiode. The photodiode is used to detect a laser beam which has been branched, with use of a dividing optical fiber, from the laser beam generated by the fiber laser unit FLUi. In addition, the laser power measuring section Mi supplies, to the control section C described later, a signal which indicates a measurement value Pi.

Note that each laser power measuring section Mi is not limited to the configuration in which the power of the laser beam, which has been branched with use of the dividing optical fiber, is measured. For example, it is possible that each laser power measuring section Mi is provided so as to be away from the laser delivery fiber LDFi by a certain distance so that the laser power measuring section Mi detects Rayleigh scattered light of light which is propagating through the laser delivery fiber LDFi. The laser power measuring section Mi thus configured is a so-called Rayleigh monitor.

The control section C controls the strength of a driving current Ii to be supplied to excitation light sources PS1 to PSm in each fiber laser unit FLUi so that (i) a difference in power between the respective laser beams generated by the fiber laser units FLU1 to FLUn is small (desirably 0) and (ii) the power of the output light generated by the output combiner OC is close to (desirably matches) a target value P0 which is set by a user. The functions of the control section C will be described in detail later with reference to another drawing.

The memory section ME stores coefficients $\alpha i$ corresponding to the respective fiber laser units FLUi. The coefficients $\alpha i$ are each a coefficient to which the control section C refers in order to control the strength of the driving current Ii supplied to the excitation light sources PS1 to PSm in the corresponding fiber laser unit FLUi. The coefficients $\alpha i$ are each set by the control section C according to the sudden-death number of the excitation light sources PS1 to PSm included in the corresponding fiber laser unit FLUi. Note that the sudden-death number of the excitation light sources PS1 to PSm means the number of the excitation light sources which already encountered sudden deaths (i.e., became incapable of emitting light due to random failure) among the excitation light sources PS1 to PSm. Concrete definitions of the coefficients $\alpha i$ will be described later. The memory section ME stores a threshold sudden-death number to which the control section C refers as described later. The threshold sudden-death number is determined in advance according to the specifications and the like of the fiber laser units FLUi.

In a case where any of estimated sudden-death numbers estimated by sudden-death number estimating sections $C04\_1$ to $C04\_n$ included in the control section C reaches a threshold sudden-death number which is a predetermined number, the control section C controls the informing section IN to inform the user of such. The informing section IN can be configured to inform the user of such by: (1) emitting a sound (by, for example, raising an alarm); (2) displaying characters or an image; or (3) emitting a sound and displaying characters or an image. If the informing section IN is configured to emit a sound, the IN can include, for example, a speaker. If the informing section IN is configured to display characters or an image, the informing section IN can include, for example, a display device. The display device can be, for example, a liquid crystal display. The functions of the sudden-death number estimating sections $C04\_1$ to $C04\_n$ will be described later in detail.

(Configuration of Fiber Laser Unit)

The configuration of the fiber laser unit FLU1 included in the fiber laser system FLS will be described with reference to FIG. 1. The fiber laser units FLU2 to FLUn are configured as with the fiber laser unit FLU1.

The fiber laser unit FLU1 is a forward excitation fiber laser. As illustrated in FIG. 1, the fiber laser unit FLU1 includes (i) a current source CS1, (ii) m excitation light sources PS1 to PSm, (iii) m excitation delivery fibers PDF1 to PDFm, (iv) an excitation combiner PC, (v) a high-reflective fiber Bragg grating FBG-HR, (vi) an amplifying fiber AF, and (vii) a low-reflective fiber Bragg grating FBG-LR. The excitation light sources PS1 to PSm and the excitation delivery fibers PDF1 to PDFm are in one-to-one correspondence with each other. Note that m is a natural number of 2 or greater, and represents the number of the excitation light sources PS1 to PSm and the number of the excitation delivery fibers PDF1 to PDFm. FIG. 1 illustrates an example of a configuration of the fiber laser unit FLU1 in which m is 6.

The current source CS1 supplies a driving current I1 to the excitation light sources PS1 to PSm. The strength of the driving current I1 is controlled by the control section C. Each excitation light source PSj (where j is a natural number of 1 or greater and m or less) generates an excitation light beam. The power of the excitation light beam generated by the each excitation light source PSj depends on the strength of the driving current I1 supplied from the current source CS. According to one or more embodiments, the excitation light sources PS1 to PSm are each a laser diode. The excitation light source PSj is connected to an input terminal of the corresponding excitation delivery fiber PDFj. The excitation light beam generated by the excitation light source PSj is introduced into the corresponding excitation delivery fiber PDFi.

The excitation delivery fiber PDFj guides the excitation light beam generated by the corresponding excitation light source PSj. An output terminal of the excitation delivery fiber PDFj is connected to an input port of the excitation combiner PC. The excitation light beam, which has been generated by the excitation light source PSj and guided through the excitation delivery fiber PDFj, is introduced into the excitation combiner PC through via the input port.

The excitation combiner PC combines excitation light beams generated by the excitation light sources PS1 to PSm and guided through the excitation delivery fibers PDF1 to PDFm. An output port of the excitation combiner PC is connected to an input terminal of the amplifying fiber AF via the high-reflective fiber Bragg grating FBG-HR. Of the combined excitation light beam synthesized by the excitation combiner PC, an excitation light beam having passed through the high-reflective fiber Bragg grating FBG-HR is introduced into the amplifying fiber AF.

The amplifying fiber AF generates a laser beam from the excitation light beam having passed through the high-reflective fiber Bragg grating FBG-HR. In one or more embodiments, a double cladding fiber whose core is doped with a rare-earth element (e.g., Yb) is used as the amplifying fiber AF. The excitation light beam having passed through the high-reflective fiber Bragg grating FBG-HR is used to maintain the rare-earth element in a population inversion state. An output terminal of the amplifying fiber AF is connected to an input terminal of the laser delivery fiber LDF1 via the low-reflective fiber Bragg grating FBG-LR. The high-reflective fiber Bragg grating FBG-HR serves as a mirror at a certain wavelength λ (e.g., 1060 nm) (the reflectance is, for example, 99%). The low-reflective fiber Bragg grating FBG-LR serves as a half mirror at the wavelength λ (the reflectance is, for example, 10%). Therefore, the amplifying fiber AF constitutes, together with the high-reflective fiber Bragg grating FBG-HR and the low-reflective fiber Bragg grating FBG-LR, a resonator for oscillating a laser beam having the wavelength λ. Of the laser beams generated by the amplifying fiber AF, the laser beam having passed through the low-reflective fiber Bragg grating FBG-LR is introduced into the laser delivery fiber LDF1.

According to one or more embodiments, the fiber laser units FLU1 to FLUn are each a forward excitation fiber laser. However, the present invention is not limited to such a configuration. According to the present invention, the fiber laser units FLU1 to FLUn can each be a backward excitation fiber laser or a bidirectional excitation fiber laser.

In addition, according to one or more embodiments, the fiber laser system FLS includes a plurality of resonator-type fiber laser units FLUi. However, the fiber laser system FLSs in accordance with an aspect of the present invention can include the following which are provided downstream of the output combiner OC: (a) a plurality of excitation light sources and (b) an amplifying fiber. In this case, (i) a portion including the plurality of fiber laser units FLUi and the output combiner OC serves as a master oscillator (MO) part for generating a seed beam and (ii) a portion including the plurality of excitation light sources and the amplifying fiber provided downstream of the output combiner OC serves as a power amplifier (PA) part. That is, an aspect of the present invention is suitable for an MOPA-type fiber laser system.

(Configuring Control Section)

Figure 2:
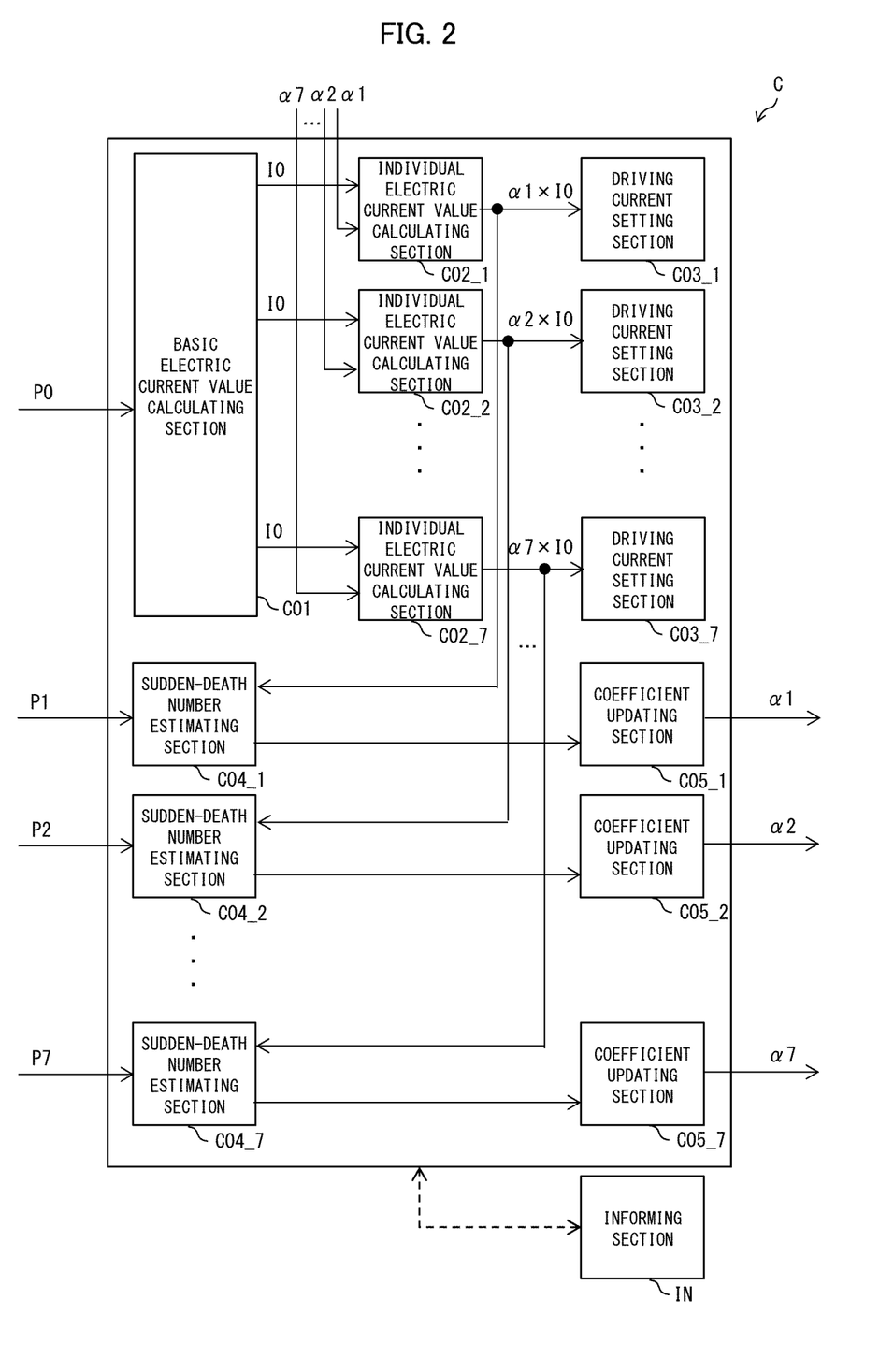
FIG. 2 is a view illustrating a configuration of functional blocks of a control section in accordance with one or more embodiments of the present invention.

The functions of the control section C will be described with reference to FIG. 2. FIG. 2 is a functional diagram indicating the functions of the control section C. In the example of FIG. 2, the control section C includes (i) a basic electric current value calculating section C01; (ii) individual electric current value calculating sections C02_1 to C02_$n$; (iii) driving current setting sections C03_1 to C03_$n$; (iv) the sudden-death number estimating sections C04_1 to C04_$n$; and (v) coefficient updating sections C05_1 to C05_$n$. As with FIG. 1, FIG. 2 shows an example of a configuration of the control section C in which n is 7. The sudden-death number estimating sections C04_1 to C04_$n$ are an aspect of the estimating section recited in Claims.

The basic electric current value calculating section C01, the individual electric current value calculating sections C02_1 to C02_$n$, and the driving current setting sections C03_1 to C03_$n$ are configured to control a driving current Ii to be supplied to excitation light sources PS1 to PSm in each fiber laser unit FLUi so that (i) a difference in power between the respective laser beams generated by the fiber laser units FLU1 to FLUn is small (desirably 0) and (ii) the power of the output light generated by the output combiner OC is close to (desirably matches) a target value P0 which is set by a user. The functions of the basic electric current value calculating section C01, the individual electric current value calculating sections C02_1 to C02_$n$, and the driving current setting sections C03_1 to C03_$n$ are as follows.

The basic electric current value calculating section C 01 calculates a basic electric current value I0 on the basis of the target value P0 set by the user. Note that the basic electric current value I0 means an electric current value of a driving current to be supplied, for causing the power of the output light generated by the output combiner OC to match the target value P0, to the excitation light sources PS1 to PSm in each fiber laser unit FLUi when the sudden-death number of the excitation light sources PS1 to PSm among all of the fiber laser units FLU1 to FLUn is 0.

For example, the basic electric current value calculating section C01 calculates the basic electric current value I0 with use of a predetermined function Pm(I). The function Pm(I) is a function representing a relationship between (i) an electric current value I of a driving current supplied to m excitation light sources PS1 to PSm and (ii) a sum Pm of the power of the excitation light beams outputted from the m excitation light sources PS1 to PSm. In this case, an electric current value I satisfying "Pm (I)=P0" becomes the basic electric current value I0. Alternatively, the basic electric current value calculating section C01 calculates the basic electric current value I0 with use of a predetermined table Tm. The table Tm is a table in which the following are associated with each other: (i) electric current values I of a driving current supplied to m excitation light sources PS1 to PSm and (ii) corresponding sums Pm of the power of the excitation light beams outputted from the m excitation light sources PS1 to PSm. In the table Tm, an electric current value I associated with power Pm closest to the target value P0 becomes the basic electric current value 0.

Based on the basic electric current value I0 calculated by the basic electric current value calculating section C01 and on the coefficient αi stored in the memory section ME, each individual electric current value calculating section C02_$i$ calculates an individual electric current value to be supplied to the excitation light sources PS1 to PSm in the corresponding fiber laser unit FLUi. More specifically, the individual electric current value calculating section C02_$i$ calculates an individual electric current value $\alpha_i \times I0$ by multiplying the basic electric current value I0 by the coefficient $\alpha i$. Each driving current setting section C03_$i$ controls the current source CS included in the corresponding fiber laser unit FLUi so that the driving current Ii to be supplied to the excitation light sources PS1 to PSm in the corresponding fiber laser unit FLUi matches the individual electric current value $\alpha i \times I0$ calculated in the corresponding individual electric current value calculating section C02_$i$.

Depending on the sudden-death number of the excitation light sources PS1 to PSm in the corresponding fiber laser unit FLUi, the sudden-death number estimating sections C04_1 to C04_$n$ and the coefficient updating sections C05_1 to C05_$n$ set the coefficients $\alpha i$ to which the respective individual electric current value calculating section C02_$i$ refer. The functions of the sudden-death number estimating sections C04_1 to C04_$n$ and the coefficient updating sections C05_1 to C05_$n$ are as follows.

Based on a measurement value Pi of the power of the laser beam measured by the laser power measuring section Mi, each sudden-death number estimating section C04_$i$ estimates the sudden-death number of the excitation light sources PS1 to PSm in the corresponding fiber laser unit FLUi.

Figure 3:
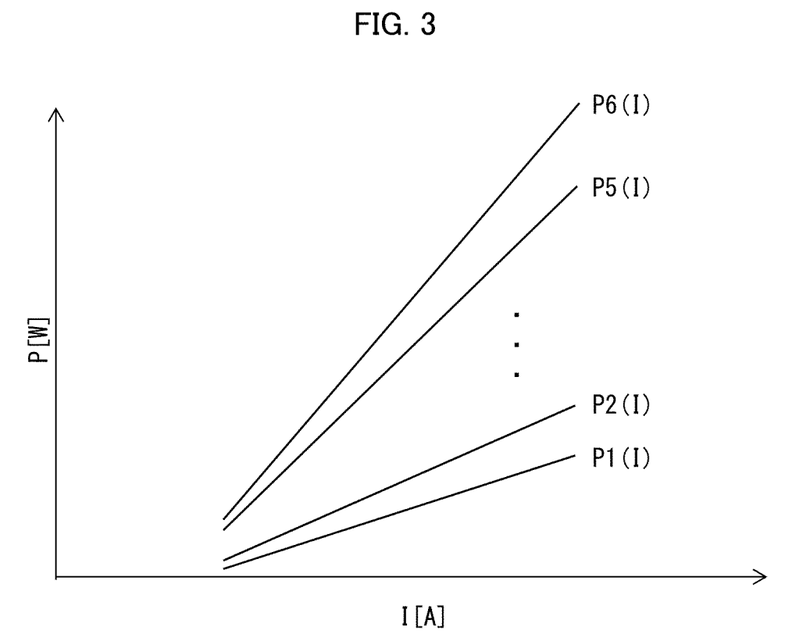
FIG. 3 is a view for explaining a relationship between a driving current supplied to a fiber laser unit and the power of a laser beam in one or more embodiments of the present invention.

For example, with use of predetermined m functions P1(I) to Pm(I), each sudden-death number estimating section C04_$i$ estimates the sudden-death number of the excitation light sources PS1 to PSm in the corresponding fiber laser unit FLUi. The function Pj(I) is a function representing a relationship between (i) an electric current value I of a driving current supplied to j excitation light sources PS1 to PSj and (ii) the power P of the laser beam generated by the fiber laser unit FLUi in a case where the excitation light beams are outputted from the m excitation light sources PS1 to PSj (where j is any of 1 to m). FIG. 3 is a graph illustrating an example of these functions P1(I) to Pm(I). In this case, the sudden-death number estimating section C04_$i$ calculates the power Pj(Ji) by substituting the driving current Ii (i.e., the individual electric current value $\alpha i \times I0$ which has been applied at a time point at which the measurement value Pi was obtained) into each function Pj(I). Then, the sudden-death number estimating section C04_$i$ recognizes, among the calculated power P1(Ii) to Pm(Ji), the power which is closest to the measurement value Pi. If the power closest to the measurement value Pi is Pk(Ji), then the sudden-death number estimating section C04_$i$ estimates that the survival number of the excitation light sources PS1 to PSm is k, that is, the sudden-death number of the excitation light sources PS1 to PSm is (m−k). For example, if the power closest to the measurement value Pi is P1(Ii), then the sudden-death number estimating section C04_$i$ estimates that the survival number of the excitation light sources PS1 to PSm is 1, that is, the sudden-death number of the excitation light sources PS1 to PSm is (m−1). If the power closest to the measurement value Pi is P2(Ii), then the sudden-death number estimating section C04_$i$ estimates that the survival number of the excitation light sources PS1 to PSm is 2, that is, the sudden-death number of the excitation light sources PS1 to PSm is (m−2). Alternatively, with use of predetermined m tables T1 to Tm, each sudden-death number estimating section C04_$i$ estimates the sudden-death number of the excitation light sources PS1 to PSm in the corresponding fiber laser unit FLUi. Note that a table Tj is a table in which the following are associated with each other: (i) an electric current value I of a driving current supplied to j excitation light sources PS1 to PSj and (ii) the power Pj of the laser beam generated by the fiber laser unit FLUi in a case where the excitation light beams are outputted from the m excitation light sources PS1 to PSj (where j is any of 1 to m). In this case, the sudden-death number estimating section C04_$i$ selects the power Pj(Ii) associated with the electric current value I which is closest to the driving current Ii in each the table Tj. Then, the sudden-death number estimating section C04_$i$ recognizes, among the selected power P1(Ii) to Pm(Ii), the power which is closest to the measurement value Pi. If the power closest to the measurement value Pi is Pk(Ii), then the sudden-death number estimating section C04_$i$ estimates that the survival number of the excitation light sources PS1 to PSm is k, that is, the sudden-death number of the excitation light sources PS1 to PSm is (m−k).

If the sudden-death number estimated by the sudden-death number estimating section C04_$i$ reaches a predetermined threshold sudden-death number, then the control section C controls the informing section IN to inform the user of such. In this case, the control section C (1) recognizes, among the fiber laser units FLU1 to FLU7, the fiber laser unit(s) in which the sudden-death number has reached the threshold sudden-death number and (2) controls the informing section IN to inform the user of (i) information identifying the fiber laser unit(s) thus recognized and (ii) information indicating that the threshold sudden-death number has reached the predetermined threshold sudden-death number.

According to this configuration, it is the informing section IN which informs the user that the sudden-death number has reached the predetermined number. This allows the user to know that the sudden-death number has reached the predetermined number in any one(s) of the fiber laser units FLU1 to FLU7. That is, the user can know that the time suitable for replacing any one(s) of the fiber laser units FLU1 to FLU7 has been reached. Because the informing section IN informs the user of, in addition to the fact that the threshold sudden-death number has reached the predetermined number, the information identifying the fiber laser unit in which the threshold sudden-death number has reached the predetermined number, the user can easily recognize the fiber laser unit in which the threshold sudden-death number has reached the predetermined number.

Based on the sudden-death number estimated by the sudden-death number estimating section C04_$i$, the coefficient updating section C05_$i$ updates a coefficient $\alpha i$ stored in the memory section ME, which coefficient $\alpha i$ concerns the corresponding fiber laser unit FLUi. For example, if the sudden-death number estimated by the sudden-death number estimating section C04_$i$ is 1, the coefficient updating section C05_$i$ sets the coefficient $\alpha i$ in the memory section ME to $\alpha i = m/(m-1)$. Alternatively, if the sudden-death number estimated by the sudden-death number estimating section C04_$i$ is 2, the coefficient updating section C05_$i$ sets the coefficient $\alpha i$ in the memory section ME to $\alpha i = m/(m-2)$. In general, when the sudden-death number estimated by the sudden-death number estimating section C04_$i$ is x, the coefficient updating section C05_$i$ sets the coefficient $\alpha i$ in the memory section ME to $\alpha i = m/(m-x)$.

Note that when the sudden-death number estimated by the sudden-death number estimating section C04_$i$ reaches the threshold sudden-death number, the control section C controls the strength of a driving current Ii, which is supplied to the fiber laser unit in which the sudden-death number has reached the threshold sudden-death number, so that the driving current Ii will become constant without changing. For example, the control section C can control the strength of the driving current Ii to be constant by preventing coefficient updating section C05_$i$, which corresponds to the sudden-death number estimating section C04_$i$ for which the sudden-death number has reached the threshold sudden-death number, from updating the coefficient αi.

According to one or more embodiments, the sudden-death number estimating section C04_i, which is an aspect of the estimating section, is configured to (a) estimate a survival number with use of m functions P1(I) to Pm(I) which are predetermined and then (b) estimate the sudden-death number with use of the survival number thus estimated. However, according to an aspect of the present invention, the estimating section can be configured to estimate any one of a survival number and a sudden-death number with use of a plurality of functions Pj(I) or a plurality of tables Tj.

In this case, the control section can be configured to control the informing section as follows. That is, the informing section informs the user if (i) the estimating section is configured to estimate any one of a survival number and a sudden-death number and (ii) the survival number or the sudden-death number estimated by the estimating section has reached a predetermined threshold survival number or a predetermined threshold sudden-death number, respectively.

In this case, the control section may be configured to control the strengths of driving currents so that a driving current having greater strength is supplied to each of excitation light sources included in (i) a fiber laser unit in which the survival number estimated by the estimating section is smaller or (ii) a fiber laser unit in which the sudden-death number estimated by the estimating section is larger.

In addition, the fiber laser system in accordance with an aspect of the present invention may be configured to further include a memory section in which a coefficient is stored, the coefficient corresponding to each of the plurality of fiber laser units and corresponding to at least one of a survival number and a sudden-death number of the excitation light sources included in the each of the plurality of fiber laser units. Then, the control section includes (1) a basic electric current value calculating section configured to calculate a basic electric current value on the basis of the target value, set by the user, of the power of the output light generated by the combiner, (2) an individual electric current value calculating section configured to calculate an individual electric current value corresponding to the each of the plurality of fiber laser units, on the basis of (i) the basic electric current value calculated by the basic electric current value calculating section and (ii) the coefficient which is stored in the memory section and which corresponds to the each of the plurality of fiber laser units, and (3) a driving current setting section configured to set, to the individual electric current value calculated by the individual electric current value calculating section, the strength of the driving current to be supplied to the each of the excitation light sources included in the each of the plurality of fiber laser units.

In addition, the fiber laser system in accordance with an aspect of the present invention may be configured to further include: a laser power measuring section configured to measure power of a laser beam generated by each of the plurality of fiber laser units. Then, the control section further includes (4) an estimating section configured to estimate, on the basis of the power of the laser beam of the each of the plurality of fiber laser units measured by the laser power measuring section, at least one of the survival number and the sudden-death number of the excitation light sources included in the each of the plurality of fiber laser units and (5) a coefficient updating section configured to update, on the basis of the at least one of the survival number and the sudden-death number estimated by the estimating section, the coefficient which is stored in the memory section and which corresponds to the each of the plurality of fiber laser units.

A method of controlling the fiber laser system FLS thus configured includes: (a) a short-cycle control S1 repeated at relatively short intervals (e.g., once every second); and (b) a long-cycle control S2 repeated at relatively long intervals (e.g., once every hour). This control will be described below with reference to FIGS. 4 and 5. It is assumed that initial values of the coefficients a1 to an stored in the memory section ME are 1. It is also assumed that the above-described functions P1(I) to Pm(I) or tables T1 to Tm are stored in the memory section ME.

Figure 4:
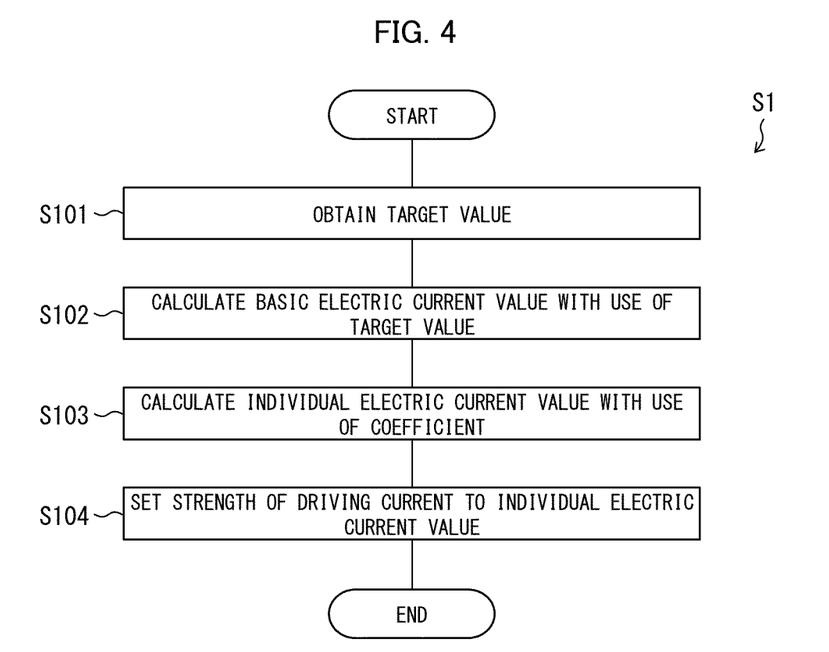
FIG. 4 is a flowchart for explaining a method of controlling the fiber laser system in accordance with one or more embodiments of the present invention.

FIG. 4 is a flowchart illustrating a flow of the short-cycle control S1. The short-cycle control S1 includes the following steps S101 to S104.

Step S101: The basic electric current value calculating section C01 obtains a target value P. If no target value P is inputted, a predetermined value can be used as the target value P.

Step S102: Based on the target value P obtained in the step S101, the basic electric current value calculating section C01 calculates a basic electric current value I0.

Step S103: With use of the basic electric current value I0 calculated in the step S102 and a coefficient αi stored in the memory section ME, each individual electric current value calculating section C02_i calculates an individual electric current value αi×I0.

Step S104: Each driving current setting section C03_i sets, to the individual electric current value αi×I0 calculated in the step S103, the strength of a driving current Ii supplied to excitation light sources PS1 to PSm in a corresponding fiber laser unit FLUi.

Figure 5:
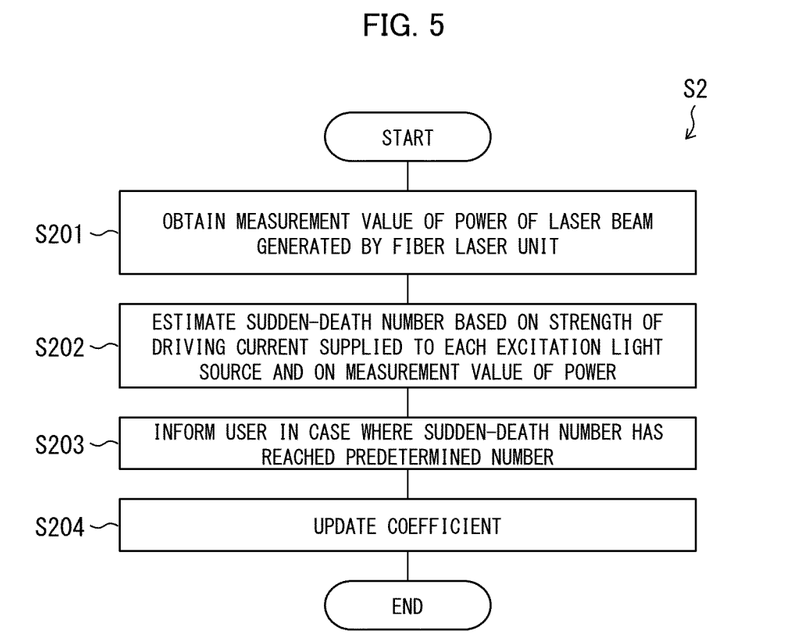
FIG. 5 is a flowchart for explaining another method of controlling the fiber laser system in accordance with one or more embodiments of the present invention.

FIG. 5 is a flowchart illustrating a flow of the long-cycle control S2. The long-cycle control S2 includes the following steps S201 to S204.

Step S201: Each sudden-death number estimating section C04_i obtains, from a laser power measuring section Mi, a measurement value Pi of the power of a laser beam generated by a corresponding fiber laser unit FLUi.

Step S202: For the corresponding fiber laser unit FLUi, the sudden-death number estimating section C04_i estimates a sudden-death number of excitation light sources PS1 to PSm on the basis of (i) the measurement value Pi obtained in the step S201 and (ii) the individual electric current value αi×I0.

Step S203: The control section C controls the informing section IN as follows: That is, if the sudden-death number estimated by the sudden-death number estimating section C04_i reaches a threshold sudden-death number, the informing section IN informs a user of such. In addition, the control section C controls the strength of a driving current Ii, which is supplied to the fiber laser unit in which the sudden-death number has reached the threshold sudden-death number, so that the driving current Ii will become constant without changing.

Step S204: Based on the sudden-death number estimated in step S202, the coefficient updating section C05_i then (a) calculates a new value of the coefficient αi and (b) updates the value of the coefficient αi stored in the memory section ME.

Effects of Present Embodiment

The control section C described in one or more embodiments is configured to (a) calculate and store, at any time point, a coefficient αi corresponding to the sudden-death number of excitation light sources PS1 to PSm included in each fiber laser unit FLUi and (b) control, according to the value of the coefficient $\alpha i$, the strength of a driving current Ii to be supplied to each fiber laser unit FLUi.

More specifically, the control section C controls the strengths of the driving currents Ii so that a stronger driving current Ii is supplied to a fiber laser unit FLUi for which the sudden-death number estimated by the sudden-death number estimating section C04_$i$ is larger. That is, assume a case where a comparison is made between any two fiber laser units of seven fiber laser units FLUs 1 to FLU7. In this case, the control section C controls the strength of a driving current to be supplied to each excitation light source included in each fiber laser unit so that the following first strength is greater than the following second strength: (i) the first strength is the strength of a driving current to be supplied to each excitation light source included in a fiber laser unit in which the above-described sudden-death number is large; and (ii) the second strength is the strength of a driving current to be supplied to each excitation light source included in a fiber laser unit in which the above-described sudden-death number is small. This likewise applies to the control method.

As a result, even if the sudden-death number of the excitation light sources PS1 to PSm differs between the fiber laser units FLUi, it is still possible to restrict variation in the power of laser beams generated in the fiber laser units FLUi. With one or more embodiments, therefore, it is possible to achieve a fiber laser system in which a failure caused by Stokes oscillation is unlikely to occur.

Variations

In addition to the configuration illustrated in FIG. 1, the fiber laser system FLSs can further include an output power measuring section. The output power measuring section measures the power of output light synthesized by the output combiner OCs. For example, an output power measuring section M can carry out measurement by detecting, with use of a photodiode, a laser beam branched from a laser beam guided through the output delivery fiber ODF. In addition, the output power measuring section supplies, to the control section C, a signal which indicates a measurement value P.

In this case, the basic electric current value calculating section C01 in the control section C calculates a basic electric current value I0 on the basis of: (a) a target value P0 set by a user; and (b) the measurement value P measured by the output power measuring section. Specifically, when the basic electric current value calculating section C01 determines that the measurement value P is not equal to the target value P0, the basic electric current value calculating section C01 can calculate, as a new basic electric current value I0, a value obtained by multiplying, by P0/P, the basic electric current value I0 calculated as described above.

Software Implementation Example

Functional blocks of the control section C of the fiber laser system FLS (particularly, the basic electric current value calculating section C01, the individual electric current value calculating section C02_$i$, the driving current setting section C03_$i$, the sudden-death number estimating section C04_$i$, and the coefficient updating section C05_$i$) can be realized by a logic circuit (hardware) provided in an integrated circuit (IC chip) or the like or can be alternatively realized by software.

In the latter case, the fiber laser system FLS includes a computer that executes instructions of a program that is software realizing the foregoing functions. The computer, for example, includes at least one processor and a computer-readable storage medium in which the program is stored. Embodiments of the present invention can be achieved by the processor of the computer reading and executing the program stored in the storage medium. Examples of the processor encompass a central processing unit (CPU). Examples of the storage medium encompass a "non-transitory tangible medium" such as a read only memory (ROM), a tape, a disk, a card, a semiconductor memory, and a programmable logic circuit. The computer may further include a random access memory (RAM) or the like in which the program is loaded. Further, the program may be made available to the computer via any transmission medium (such as a communication network and a broadcast wave) which allows the program to be transmitted. Note that an aspect of the present invention can also be achieved in the form of a computer data signal in which the program is embodied via electronic transmission and which is embedded in a carrier wave.

(Recap)

A fiber laser system in accordance with one or more embodiments of the present invention includes: a plurality of fiber laser units; a combiner configured to combine laser beams generated by the respective plurality of fiber laser units; and a control section configured to control strength of a driving current to be supplied to each of excitation light sources included in each of the plurality of fiber laser units so that a difference in power between the respective laser beams generated by the plurality of fiber laser units is small.

A control method in accordance with one or more embodiments of the present invention is a method of controlling a fiber laser system, the fiber laser system including: a plurality of fiber laser units; and a combiner configured to combine laser beams generated by the respective plurality of fiber laser units. The method includes the step of: (a) controlling strength of a driving current to be supplied to each of excitation light sources included in each of the plurality of fiber laser units so that a difference in power between the respective laser beams generated by the plurality of fiber laser units is small.

With the arrangements above, it is possible to restrict the variance in the power of the laser beams generated by the respective fiber laser units. It is therefore possible to achieve a fiber laser system in which a failure caused by Stokes oscillation is unlikely to occur.

The fiber laser system in accordance with one or more embodiments of the present invention may be arranged so that the control section controls the strength of the driving current to be supplied to the each of the excitation light sources included in the each of the plurality of fiber laser units so that (i) the difference in the power between the respective laser beams generated by the plurality of fiber laser units is small and (ii) power of output light generated by the combiner is close to a target value set by a user.

The fiber laser system control method in accordance with one or more embodiments of the present invention may be arranged so that in the step (a), the strength of the driving current to be supplied to the each of the excitation light sources included in the each of the plurality of fiber laser units is controlled so that (i) the difference in the power between the respective laser beams generated by the plurality of fiber laser units is small and (ii) power of output light generated by the combiner is close to a target value set by a user.

With the arrangements above, it is possible to restrict the variance in the power of the laser beams generated by the respective fiber laser units even while the laser beams having power close to the target value set by the user is outputted.

The fiber laser system in accordance with one or more embodiments of the present invention may be arranged to further include: an estimating section configured to estimate, on the basis of power of a laser beam generated by each of the plurality of fiber laser units, at least one of a survival number and a sudden-death number of excitation light sources included in the each of the plurality of fiber laser units, the control section controlling, according to the at least one of the survival number and the sudden-death number estimated by the estimating section, the strength of the driving current to be supplied to the each of the excitation light sources included in the each of the plurality of fiber laser units.

The fiber laser system control method in accordance with one or more embodiments of the present invention may be arranged to further include the step of: (b) estimating, on the basis of power of a laser beam generated by each of the plurality of fiber laser units, at least one of a survival number and a sudden-death number of excitation light sources included in the each of the plurality of fiber laser units, in the step (a), the strength of the driving current to be supplied to the each of the excitation light sources included in the each of the plurality of fiber laser units being controlled according to the at least one of the survival number and the sudden-death number estimated in the step (b).

If driving currents having identical strength are supplied to fiber laser units differing in sudden-death number of excitation light sources (in other words, fiber laser units differing in survival number of the excitation light sources), there occurs variance in the power of laser beams generated by the respective fiber laser units. With the arrangement above, the strength of the driving current to be supplied to each excitation light source included in each fiber laser unit is controlled by the control section according to the survival number or the sudden-death number. This makes it possible to reliably restrict the variance in the power of the laser beams generated by the respective fiber laser units.

The fiber laser system in accordance with one or more embodiments of the present invention may be arranged to further include: an estimating section configured to estimate, on the basis of power of a laser beam generated by each of the plurality of fiber laser units, at least one of a survival number and a sudden-death number of excitation light sources included in the each of the plurality of fiber laser units; and an informing section configured to inform a user in a case where the at least one of the survival number and the sudden-death number estimated by the estimating section reaches a predetermined number.

The fiber laser system control method in accordance with one or more embodiments of the present invention may be arranged to further include the steps of: (b) estimating, on the basis of power of a laser beam generated by each of the plurality of fiber laser units, at least one of a survival number and a sudden-death number of excitation light sources included in the each of the plurality of fiber laser units; and (c) informing a user in a case where the at least one of the survival number and the sudden-death number estimated in the step (b) reaches a predetermined number.

With the arrangements above, a user is informed in a case where at least one of the survival number and the sudden-death number has reached the predetermined number. This allows the user to know that time suitable for replacing the fiber laser unit, in which at least one of the survival number and the sudden-death number has reached the predetermined number, has been reached.

The fiber laser system in accordance with one or more embodiments of the present invention may be arranged so that the estimating section estimates the at least one of the survival number and the sudden-death number of the excitation light sources included in the each of the plurality of fiber laser units, on the basis of (i) the strength of the driving current supplied to the each of the excitation light sources included in the each of the plurality of fiber laser units and (ii) the power of the laser beam generated by the each of the plurality of fiber laser units.

The fiber laser system control method in accordance with one or more embodiments of the present invention may be arranged so that in the step (b), the at least one of the survival number and the sudden-death number of the excitation light sources included in the each of the plurality of fiber laser units is estimated on the basis of (i) the strength of the driving current supplied to the each of the excitation light sources included in the each of the plurality of fiber laser units and (ii) the power of the laser beam generated by the each of the plurality of fiber laser units.

With the arrangements above, it is possible to accurately estimate at least one of a survival number and a sudden-death number.

The fiber laser system in accordance with one or more embodiments of the present invention may be arranged so that the control section controls strengths of driving currents so that a driving current having greater strength is supplied to each of excitation light sources included in (i) a fiber laser unit in which the survival number estimated by the estimating section is smaller or (ii) a fiber laser unit in which the sudden-death number estimated by the estimating section is larger.

The fiber laser system control method in accordance with one or more embodiments of the present invention may be arranged so that in the step (a), strengths of driving currents are controlled so that a driving current having greater strength is supplied to each of excitation light sources included in (i) a fiber laser unit in which the survival number estimated in the step (b) is smaller or (ii) a fiber laser unit in which the sudden-death number estimated in the step (b) is larger.

With the arrangements above, it is possible to further restrict the variance in the power of the laser beams generated by the respective fiber laser units.

The fiber laser system in accordance with one or more embodiments of the present invention can be arranged to further include: a memory section in which a coefficient is stored, the coefficient corresponding to each of the plurality of fiber laser units and corresponding to at least one of a survival number and a sudden-death number of the excitation light sources included in the each of the plurality of fiber laser units. The control section includes (1) a basic electric current value calculating section configured to calculate a basic electric current value on the basis of the target value, set by the user, of the power of the output light generated by the combiner, (2) an individual electric current value calculating section configured to calculate an individual electric current value corresponding to the each of the plurality of fiber laser units, on the basis of (i) the basic electric current value calculated by the basic electric current value calculating section and (ii) the coefficient which is stored in the memory section and which corresponds to the each of the plurality of fiber laser units, and (3) a driving current setting section configured to set, to the individual electric current value calculated by the individual electric current value calculating section, the strength of the driving current to be supplied to the each of the excitation light sources included in the each of the plurality of fiber laser units.

With the arrangement above, it is possible to restrict the variance in the power of laser beams generated by the fiber laser units, even if there is a difference in at least one of the survival number and the sudden-death number of the excitation light sources included in the fiber laser units.

The fiber laser system in accordance with one or more embodiments of the present invention may be arranged to further include: a laser power measuring section configured to measure power of a laser beam generated by each of the plurality of fiber laser units, the control section including (4) an estimating section configured to estimate, on the basis of the power of the laser beam of the each of the plurality of fiber laser units measured by the laser power measuring section, at least one of the survival number and the sudden-death number of the excitation light sources included in the each of the plurality of fiber laser units and (5) a coefficient updating section configured to update, on the basis of the at least one of the survival number and the sudden-death number estimated by the estimating section, the coefficient which is stored in the memory section and which corresponds to the each of the plurality of fiber laser units.

With the arrangement above, it is possible to accurately estimate, on the basis of the measurement value, at least one of the survival number and the sudden-death number of the excitation light sources included in each fiber laser unit. This allows the at least one of the survival number and the sudden-death number thus estimated to be reflected on the coefficient for use in setting the individual electric current value.

Additional Remarks

The present invention is not limited to the above embodiments, but can be altered by a skilled person in the art within the scope of the claims. The present invention also encompasses, in its technical scope, any embodiment derived by combining technical means disclosed in differing embodiments.

REFERENCE SIGNS LIST

FLS Fiber laser system
FLU1 to FLUn Fiber laser unit
LDF1 to LDFn Laser delivery fiber
OC Output combiner
ODF Output delivery fiber
OH Output head
M1 to M7 Laser power measuring section
C Control section
ME Memory section
CS1 Current source
PS1 to PS6 Excitation light source
PDF1 to PDF6 Excitation delivery fiber
PC Excitation combiner
FBG-HR High-reflective fiber Bragg grating
AF Amplifying fiber
FBG-LR Low-reflective fiber Bragg grating

The invention claimed is:
1. A fiber laser system comprising:
fiber laser units each comprising excitation light sources;
a combiner that combines laser beams generated by the respective fiber laser units;
a laser power measuring circuit that measures power of a laser beam generated by each of the fiber laser units;
a controller that controls, based on the measured power of the laser beam of each of the fiber laser units from the laser power measuring circuit and a target value of power of output light generated by the combiner, a strength of a driving current supplied to each of the excitation light sources to reduce a difference in power between the respective laser beams; and
an estimating circuit that estimates, based on the measured power of the laser beam of each of the fiber laser units, at least one of a survival number and a sudden-death number of the excitation light sources, wherein
the fiber laser system has m functions for each of the fiber laser units with the driving current as a variable where m is a total number of the excitation light sources of a fiber laser unit, wherein a power of a laser beam is calculated through each of the m functions,
for each of the fiber units, the estimating circuit:
calculates m powers of a laser beam by substituting a current driving current for each of the m functions,
determines, among the m calculated powers, a calculated power that is closest to the power of the laser beam measured when the current driving current flows, and
determines at least one of the survival number and sudden-death number through a function of the m functions that is used to the determined calculated power, and
based on the determined at least one of the estimated survival number and sudden-death number, the controller controls the strength of the driving current supplied to each of the excitation light sources.

2. The fiber laser system according to claim 1, further comprising:
an informing circuit that informs a user in a case where at least one of the estimated survival number and sudden-death number reaches a predetermined number.

3. The fiber laser system according to claim 1, wherein the controller controls the strength of the driving current supplied to each of the excitation light sources such that:
the lower the survival number, the greater the strength of the driving current, or
the higher the sudden-death number, the greater the strength of the driving current.

4. The fiber laser system according to claim 1, further comprising:
a memory in which a coefficient is stored, wherein
the stored coefficient corresponds to each of the fiber laser units and to at least one of the survival number and the sudden-death number of the excitation light sources, and
the controller:
calculates a basic electric current value based on the target value,
calculates an individual electric current value corresponding to each of the fiber laser units based on the calculated basic electric current value and the stored coefficient, and
sets, to the calculated individual electric current value, the strength of the driving current supplied to each of the excitation light sources.

5. The fiber laser system according to claim 4, wherein the controller updates, based on at least one of the estimated survival number and sudden-death number, the stored coefficient.

6. A method of controlling a fiber laser system including fiber laser units and a combiner that combines laser beams generated by the fiber laser units, the method comprising:
measuring power of a laser beam generated by each of the fiber laser units;
controlling, based on the measured power of the laser beam of each of the fiber laser units from the laser power measuring circuit and a target value of power of output light generated by the combiner, a strength of a driving current supplied to each of excitation light sources included in each of the fiber laser units to reduce a difference in power between the respective laser beams; and
estimating, based on the measured power of the laser beam of each of the fiber laser units, at least one of a survival number and a sudden-death number of the excitation light sources, wherein
the method further comprises:
storing m functions for each of the fiber laser units with the driving current as a variable where m is a total number of the excitation light sources of a fiber laser unit, wherein a power of a laser beam is calculated through each of the m functions,
for each of the fiber units, the estimating comprises:
calculating m powers of a laser beam by substituting a current driving current for each of the m functions,
determining, among the m calculated powers, a calculated power that is closest to the power of the laser beam measured when the current driving current flows, and
determining at least one of the survival number and sudden-death number through a function of the m functions that is used to the determined calculated power, and
in the controlling, the strength of the driving current is controlled based on the determined at least one of the estimated survival number and sudden-death number.

7. The method according to claim 6, further comprising:
informing a user in a case where at least one of the estimated survival number and sudden-death number reaches a predetermined number.

8. The method according to claim 6, wherein
in the controlling, the strength of the driving current supplied to each of the excitation light sources is controlled such that:
the lower the survival number, the greater the strength of the driving current, or
the higher the sudden-death number, the greater the strength of the driving current.

* * * * *